United States Patent
Zhou et al.

(10) Patent No.: US 6,628,151 B1
(45) Date of Patent: Sep. 30, 2003

(54) SELF-REGULATING HIGH VOLTAGE RAMP UP CIRCUIT

(75) Inventors: Shi-dong Zhou, Milpitas, CA (US); Gubo Huang, Milpitas, CA (US); Andy T. Nguyen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/136,115

(22) Filed: Apr. 30, 2002

(51) Int. Cl.[7] .................................................. H03K 4/06
(52) U.S. Cl. ........................................ 327/134; 327/333
(58) Field of Search ................................ 327/134, 143, 327/170, 112, 138, 333

(56) References Cited

U.S. PATENT DOCUMENTS

| | | | | |
|---|---|---|---|---|
| 5,203,867 A | * | 4/1993 | Love et al. | 327/143 |
| 5,598,111 A | * | 1/1997 | Enomoto | 326/83 |
| 6,169,421 B1 | * | 1/2001 | Bryan et al. | 326/83 |
| 6,172,575 B1 | * | 1/2001 | Shinmori | 331/116 FE |

* cited by examiner

Primary Examiner—Timothy P. Callahan
Assistant Examiner—Cassandra Cox
(74) Attorney, Agent, or Firm—Lois D. Cartier (57) ABSTRACT

A self-regulating ramp up circuit generates a high voltage signal having a slow, smooth ramp up and reduced process and temperature variation. The circuit uses a resistor and a capacitor to control the rate at which the output signal changes state. In one embodiment, an enable signal operating at a low voltage level is shifted to the desired high voltage level using a level shifter. The resulting value is inverted using an inverter operating at the high voltage level and having a resistor in the pulldown path. The circuit output node is coupled to the output node of the inverter through a capacitor, and to the high voltage power supply through a pullup gated by the output node of the inverter. In some embodiments, the ramp up circuit forms a portion of a programmable logic device (PLD), and the capacitor and/or resistor have programmable capacitance/resistance values.

21 Claims, 5 Drawing Sheets

SELF-REGULATING HIGH VOLTAGE RAMP UP CIRCUIT

FIELD OF THE INVENTION

The invention relates to high voltage circuits in integrated circuits (ICs). More particularly, the invention relates to a self-regulating high voltage ramp up circuit for an IC.

BACKGROUND OF THE INVENTION

While most available ICs operate at fairly standard voltage levels (e.g., 3.3 volts, 2.7 volts, or 1.8 volts), some ICs require the application of significantly higher voltages on a temporary basis. For example, ICs that include static memory cells (e.g., PROMs, EPROMs, EEPROMs, and FLASH memory devices) require the application of high voltages to program values into the static memory cells. These ICs have special design requirements to avoid damaging the ICs during the application of the high programming voltages.

For example, a transistor programmed by the application of a high voltage typically has a thicker oxide and a longer channel length than a standard transistor. These attributes allow the high voltage transistor to handle the additional voltage without breaking down. For example, a given low voltage transistor might have an oxide thickness of about 33 Angstroms and a channel length of 0.18 microns and be able to handle up to 1.8 volts. However, a high voltage transistor on the same IC might have an oxide thickness of about 120 Angstroms and a channel length of 0.9 microns and be able to handle up to 15 volts.

For reliability reasons, it is desirable that a high voltage N-channel transistor not be exposed to a voltage switching very rapidly from zero volts to (for example) 15 volts. Similarly, a high voltage P-channel transistor should not be exposed to a voltage switching very rapidly from 15 volts to zero volts. Such rapid voltage alterations can stress the transistors undesirably, particularly if the voltage applications are repeated as the device is reprogrammed. By reducing the speed of the voltage transitions, the thick oxide and the transistor channels are protected from stress and the life of the device is extended.

Further, a very rapid voltage change at a high voltage node can cause a sympathetic change in other nodes located nearby. This inadvertent coupling effect can cause undesired changes of state in the nearby nodes, causing the device to function improperly.

Therefore, circuits and techniques have been developed to control and reduce the ramp up rate on output nodes driving high voltage transistors. While typical low voltage transistors turn on in the range of nanoseconds, the rise time of a high voltage node is preferably in the range of hundreds of microseconds, or even milliseconds.

Figure 1:
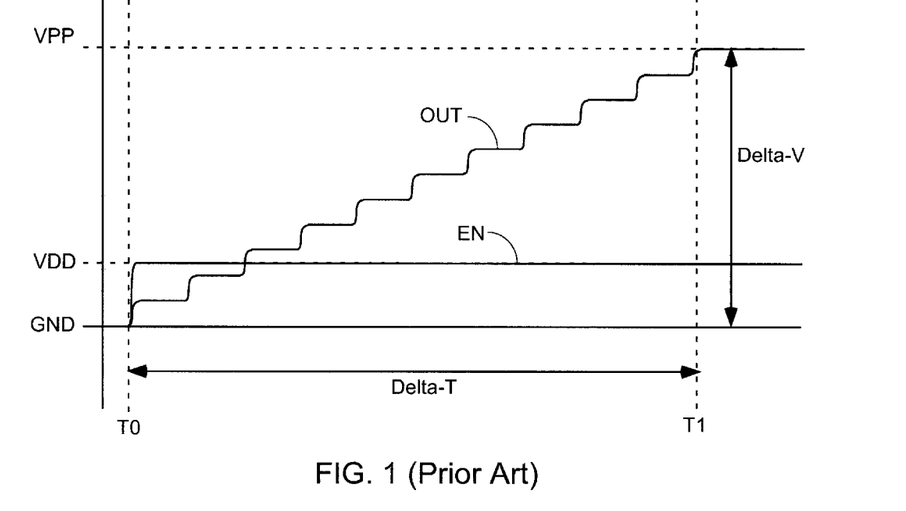
FIG. 1 is a timing diagram illustrating a typical controlled ramp up on a high voltage signal generated by a prior art circuit.

FIG. 1 shows a typical waveform for a high voltage output node ramping up in a controlled fashion. The output node OUT is controlled by a series of delayed pulses initiated by enable signal EN, which goes high to the low voltage supply VDD at time T0. (voltage level VDD, the operating voltage, is referred to herein as the low voltage supply. Voltage level VPP, the programming voltage, is referred to herein as the high voltage supply. Typical values for VDD and VPP can be about 1.8 volts and 15 volts, respectively.) Each of the delayed pulses allows the voltage on output node OUT to increase by another small amount. Therefore, the resulting waveform resembles a "stair-step" function, reaching the high voltage supply VPP at time T1. Ideally, the ramp up curve is as smooth and linear as possible, because minimizing the abrupt changes in voltage also minimizes the resulting stress on the IC.

Figure 2:
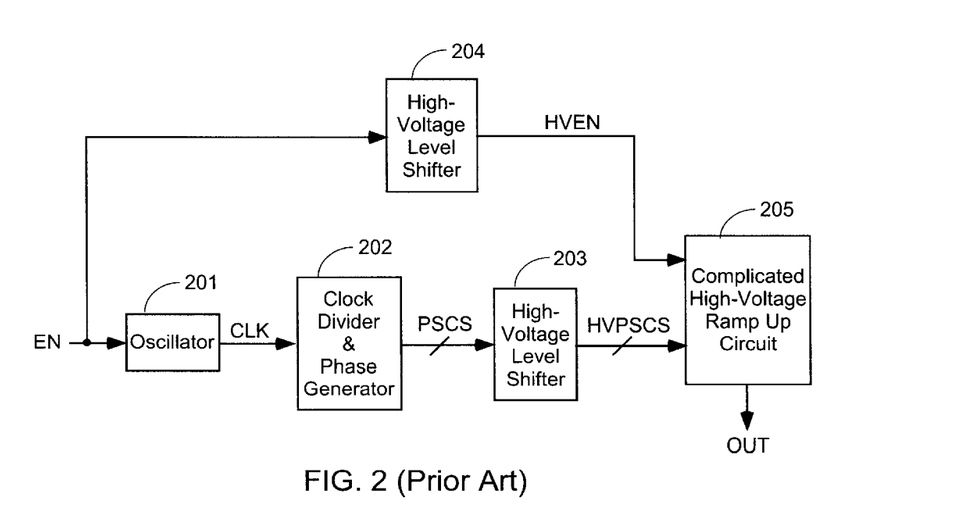
FIG. 2 shows a prior art circuit that generates a signal having the waveform shown in FIG. 1.

FIG. 2 shows a typical high voltage ramp up circuit. In response to an enable signal EN, the prior art circuit of FIG. 2 generates a first clock signal CK using oscillator 201, where clock signal CK oscillates as long as the enable signal is high. Clock divider and phase generator 202 then slows down clock signal CK and uses the slowed clock signal to generate a series of phase-shifted clock signals PSCS. Phase-shifted clock signals PSCS are boosted to the high voltage level VPP using high voltage level shifter 203, producing high voltage phase-shifted clock signals HVPSCS.

At the same time, the circuit also boosts the enable signal EN to the high voltage level VPP, using high voltage level shifter 204. The resulting high voltage enable signal HVEN and the high voltage phase-shifted clock signals HVPSCS are used to control a complicated high voltage ramp up circuit 205, which generates the high voltage output signal OUT. Ramp up circuit 205 includes a charge pump, which necessitates the generation of the series of phase-shifted clock signals.

There are several drawbacks to the circuit of FIG. 2. Firstly, the circuit has a high current consumption, because each of blocks 201–205 in FIG. 2 consumes a significant amount of current. Secondly, and in some cases very importantly, the ramp up curve can vary significantly from the usual curve for this circuit (such as that depicted in FIG. 1). For the circuit of FIG. 2, the ramp up curve depends on the timing of the phase-shifted clock signals, and this timing is heavily dependent on variations in IC fabrication processing and operating temperature. Thus, the time required to reach the high voltage level VPP (Delta-T in FIG. 1) can vary widely. An IC product is guaranteed to operate at a certain speed at a given temperature. Therefore, a wide variation in the time required to program the static memory of an IC (an inevitable result of a wide variation in Delta-T) has an undesirable impact on the specifications for the IC product as a whole.

Therefore, it is desirable to provide a self-regulating high voltage ramp up circuit having only minor variations in ramp up speed in response to changes in fabrication process and operating temperature. It is further desirable to provide a ramp up circuit having a low current consumption.

SUMMARY OF THE INVENTION

The invention provides self-regulating ramp up circuits that generate high voltage signals having a slow and smooth ramp up curve. The ramp up circuits of the invention have significantly lower current consumption, and the resulting output signals have reduced process and temperature variation relative to prior art circuits.

The circuits of the invention use a resistor and a capacitor to control the rate at which the output signal changes state. In some embodiments, the ramp up circuit forms a portion of a programmable logic device (PLD), and the resistor has a programmable resistance value. In some embodiments, the capacitor has a programmable capacitance value. This programmability allows a PLD user to select and program a ramp up rate for the high voltage output signal.

According to one embodiment, an enable signal operating at a low voltage level is shifted to the desired high voltage level using a level shifter. The resulting value is inverted using an inverter operating at the high voltage level. The circuit output node is also coupled to the high voltage power supply through an output pullup (e.g., a P-channel transistor) gated by the output node of the inverter. Thus, the inverter places a high value on the circuit output node when the enable signal goes high.

However, the goal of the output circuit is not just to drive the circuit output node high, but to do so slowly and in a controlled fashion. Therefore, the circuit output node is also coupled to the output node of the inverter through a capacitor, which reduces the rate at which the output node can be pulled up. The ramp up rate is further reduced by including a resistor in the pulldown path of the inverter, which restricts the rate at which the output pullup can be turned on.

In some embodiments, the pulldown path of the inverter includes an additional pulldown gated by a clock signal. The clock signal is generated by providing the enable signal to an oscillator, and providing the oscillator output signal to a clock divider. The clock divider output signal gates the additional pulldown. Therefore, the signal provided by the clock divider is an oscillating signal having a reduced frequency (in some embodiments a programmable frequency) that is active only when the enable signal is active. Hence, the pulldown path through the inverter allows current flow only a fraction of the time that it would without the additional pulldown, further reducing the ramp up rate of the output signal.

According to another embodiment, a self-regulating ramp up circuit includes a level shifter, first and second pullups, a pulldown, a resistor, and a capacitor. The first pullup is coupled between a power high terminal and an internal node, with a gate terminal coupled to the output terminal of the level shifter. The second pullup is coupled between the power high terminal and a slow ramp up output terminal, with a gate terminal coupled to the internal node. The capacitor is coupled between the internal node and the slow ramp up output terminal. The first pulldown and the resistor are coupled in series between the internal node and a ground terminal. The first pulldown has a gate terminal coupled to the output terminal of the level shifter.

In some embodiments, the resistor includes a resistance element and a second pulldown coupled in series, the second pulldown having a gate terminal controlled by a biasing signal at a voltage level between that of the power high terminal and ground. The second pulldown provides added resistance that is easily modified, and permits the use of a smaller resistance element.

According to another embodiment, a programmable logic device (PLD) includes a level shifter, first and second pullups, a pulldown, a resistor, and a capacitor, coupled together as described above. However, in this embodiment the capacitor has a programmable capacitance value based on configuration data for the PLD. In another embodiment, the resistor has a programmable resistance value based on configuration data for the PLD.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

In the following description, numerous specific details are set forth to provide a more thorough understanding of the present invention. However, it will be apparent to one skilled in the art that the present invention may be practiced without these specific details.

Figure 3:
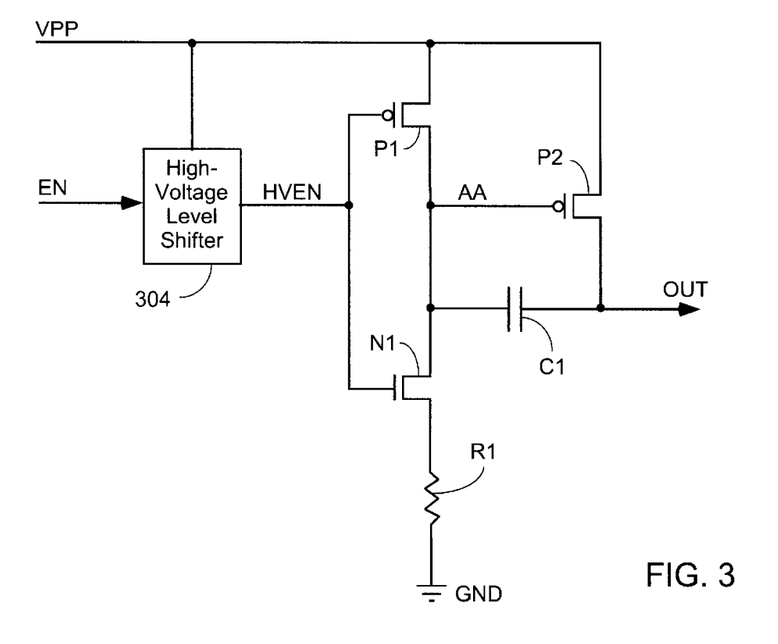
FIG. 3 shows a first self-regulating ramp up circuit according to an embodiment of the invention.

FIG. 3 shows a first self-regulating ramp up circuit according to an embodiment of the invention. The circuit includes a high-voltage level shifter 304, first and second pullups P1 and P2, a pulldown N1, a resistor R1, and a capacitor C1.

Level shifter 304 accepts enable input signal EN and provides high voltage enable signal HVEN at high voltage level VPP. (In the present specification, the same reference characters are used to refer to terminals, signal lines, and their corresponding signals.) Pullup P1 is coupled between a power high terminal at high voltage level VPP and an internal node AA. The gate terminal of pullup P1 is coupled to the output terminal of level shifter 304. Pullup P2 is coupled between the power high terminal VPP and a slow ramp up output terminal OUT. The gate terminal of pullup P2 is coupled to internal node AA. Capacitor C1 is coupled between internal node AA and output terminal OUT.

Pulldown N1 and resistor R1 are coupled in series between internal node AA and a ground terminal GND. In the pictured embodiment, pulldown N1 is closer to internal node AA and resistor R1 is closer to the ground terminal GND, but in other embodiments the order of these elements is reversed. Pulldown N1 has a gate terminal coupled to the output terminal of level shifter 304.

Capacitor C1 and resistor R1 are added to reduce and control the ramp up rate of output node OUT. When internal node AA goes low, the rate at which output node OUT acquires a high voltage is reduced by capacitor C1. Further, internal node AA is pulled low through resistor R1, which reduces the rate at which internal node AA goes low, which in turn reduces the rate at which pullup P2 turns on. Thus, each of capacitor C1 and resistor R1 reduces the ramp up rate of output node OUT.

Specifically, the circuit of FIG. 3 functions as follows. Enable signal EN operating at a low voltage level (VDD, not shown) is shifted to the desired high voltage level (VPP) in level shifter 304. Thus, whenever enable signal EN goes high, high voltage enable signal HVEN also goes high (i.e., to VPP).

High voltage enable signal HVEN is inverted by the inverter formed from pullup PI and pulldown N1, and the resulting inverted signal is supplied to internal node AA. More particularly, when high voltage enable signal HVEN goes high, pullup P1 turns off and pulldown N1 turns on. Internal node AA begins to discharge through pulldown N1, and this leakage current is limited by resistor R1.

When internal node AA drops to one threshold voltage below high voltage level VPP, pullup P2 begins to turn on and to pull output node OUT high. However, because pullup P2 is only partly on, there is a very small delta-V. Once output node OUT starts to go higher, capacitor C1 acts to pull internal node AA higher by the same amount, through capacitive coupling. Thus, pullup P2 turns off. Hence, pullup P2 and capacitor C1 form a self-regulating pullup structure.

Internal node AA continues to discharge through resistor R1. Once again, the voltage on internal node AA drops below the threshold voltage of pullup P2, and pullup P2 begins to turn on. The process continues until output node OUT has reached the voltage level VPP. At that point, internal node AA is solidly at ground and pullup P2 is solidly on, maintaining a strong voltage level of VPP at output node OUT.

When enable signal EN subsequently goes low, high voltage enable signal HVEN goes low, pullup P1 turns on and pulldown N1 turns off. Thus, internal node AA goes high, turning off pullup P2. Output node OUT either gradually goes low (due to leakage) or is driven by other logic (not shown) to a logic low or logic high value.

The circuit of FIG. 3 has another advantage over prior art ramp up circuits—a very low current consumption. As output node OUT ramps up, pullup P1 is off, so there is no current flow through pullup P1. The only current flow through output node OUT is through pullup P2, and only enough current flows through pullup P2 to charge up the output node.

The time required for output node OUT to reach voltage level VPP is controlled by the relative sizes of capacitor C1 and resistor R1. Resistor R1 must be weak enough that coupling from capacitor C1 can overcome resistor R1 to shut off pullup P2 during the slow ramp up process.

Figure 5:
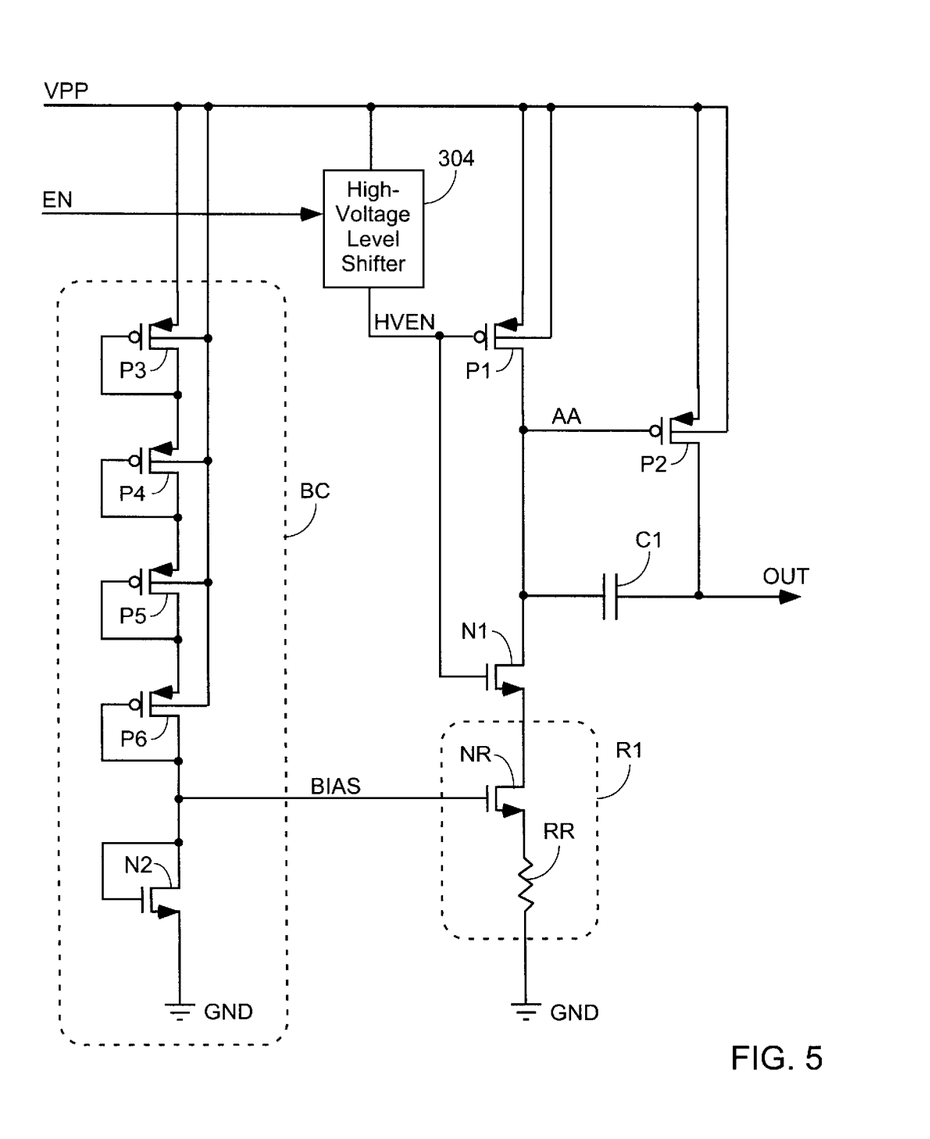
FIG. 5 shows a second self-regulating ramp up circuit according to an embodiment of the invention.

Resistor R1 and capacitor C1 can be implemented in many different ways. An exemplary implementation for resistor R1 is shown in the embodiment of FIG. 5, and is described in connection with this figure. Many other implementations for both resistors and capacitors are well known to those of skill in the art of circuit design and can be used with the circuits of the present invention.

In some embodiments, the ramp up circuit of FIG. 3 forms a portion of a programmable logic device (PLD). In some of these embodiments, resistor R1 has a programmable resistance value. In other embodiments, capacitor C1 has a programmable capacitance value. In other embodiments, both resistor R1 and capacitor C1 are programmable. In some embodiments, the resistance and/or capacitance values are programmed by writing PLD configuration data to the PLD. Programmable resistor and/or capacitance values allow the user to adjust the ramp up rate as desired.

Figure 4:
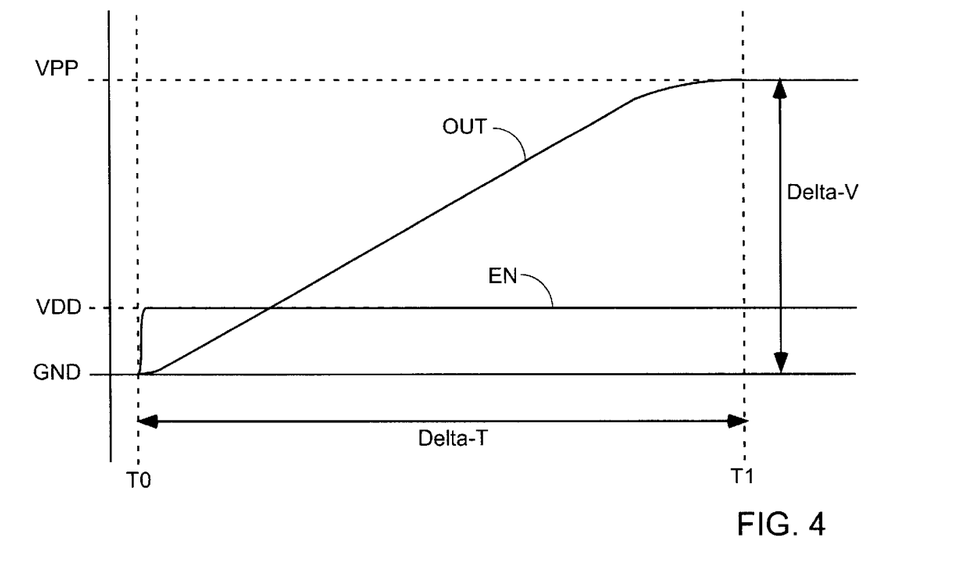
FIG. 4 is a timing diagram illustrating a controlled ramp up on a high voltage signal generated by the circuit of FIG. 3.

FIG. 4 shows a waveform for a high voltage output node ramping up when driven by the ramp up circuit of FIG. 3. As in the example of FIG. 1, enable signal EN goes high at time T0. After a short delay caused by level shifter 304 and the subsequent inverter (i.e., pullup P1 and pulldown N1), output node OUT begins to rise in response to the controlled drop on internal node AA. The rise of output node OUT is further controlled by the presence of capacitor C1 between output node OUT (which is rising) and internal node AA (which is falling). The resulting ramp up waveform is slow, smooth, and linear compared to the waveform of FIG. 1.

FIG. 5 shows a second self-regulating ramp up circuit according to the invention. This embodiment functions in the same way as the embodiment of FIG. 3, but shows specific implementations for some elements of FIG. 3 and includes an additional biasing circuit BC. To avoid repetition, other elements shown in FIG. 5 that are similar to those of FIG. 3 are not described here.

In the embodiment of FIG. 5, the ramp up circuit is implemented in an integrated circuit (IC) fabricated using a CMOS process. Pullups P1 and P2 (and new pullups P3–P6) are implemented with P-channel transistors having drains coupled to power high level VPP and N-wells also coupled to power high VPP. Pulldown N1 and new pulldowns N2 and NR are implemented as N-channel transistors.

Resistor R1 is implemented as a resistive element RR in series with new pulldown NR. In one embodiment, resistive element RR is formed from an extended length of polysilicon. Thus, resistive element RR has a fixed resistance. Pulldown NR is implemented as an N-channel transistor having a gate terminal coupled to receive a biasing signal BIAS. Thus, the resistance of pulldown NR depends on the voltage level of biasing signal BIAS.

Biasing circuit BC holds biasing signal BIAS to a voltage level somewhere between power high VPP and ground GND. Where that voltage level falls depends on how many pullups (e.g., P3–P6) and pulldowns (e.g., N2) are coupled in series to create the biasing signal, and on the sizes of these pullups and pulldowns. The voltage level on biasing signal BIAS controls how solidly pulldown NR is turned on, and hence controls the resistance of resistor R1.

In one embodiment, the ramp up circuit forms a portion of a PLD, and the pullup resistance and/or the pulldown resistance in biasing circuit BC are controlled by one or more programmable memory cells of the PLD.

Figure 6:
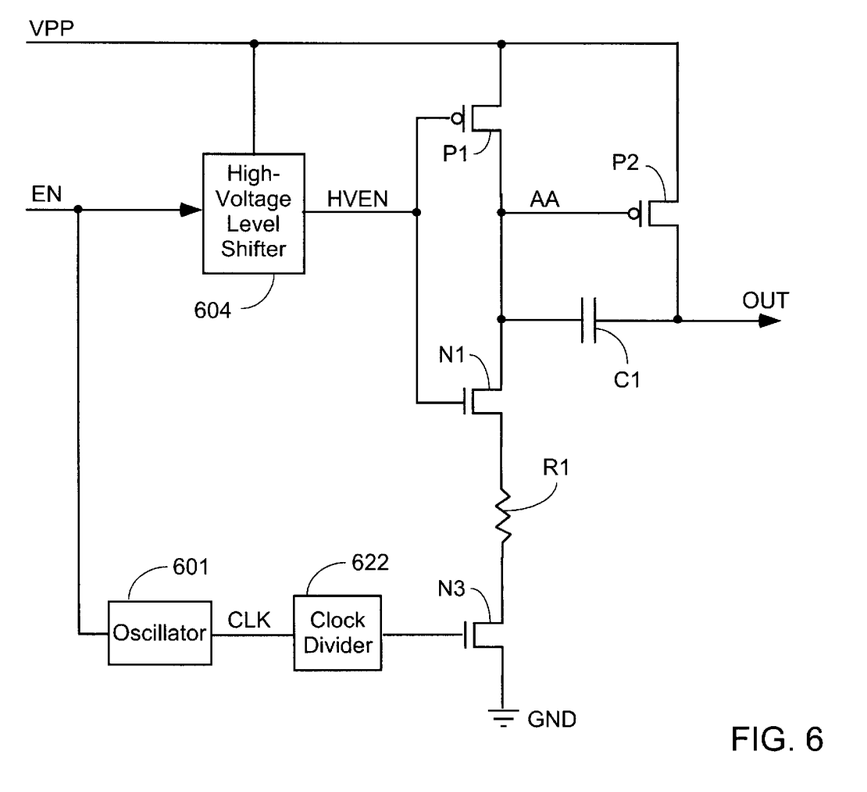
FIG. 6 shows a third self-regulating ramp up circuit according to an embodiment of the invention.

FIG. 6 shows a third self-regulating ramp up circuit according to the invention. This embodiment is similar to the embodiment of FIG. 3, but includes an additional pulldown N3 in the pulldown path. Oscillator 601 and optional clock divider 622 act to turn this additional pulldown on and off periodically, thus even further slowing the ramp up of output signal OUT.

The new elements of FIG. 6 function as follows. To generate the gating signal for pulldown N3, enable signal EN is supplied to oscillator 601. Oscillator 601 can be, for example, the same as oscillator 201 in the prior art circuit of FIG. 2. Oscillator 201 supplies an oscillating clock signal CLK for as long as enable signal EN is high. Thus, clock signal CLK is high only part of the time that enable signal EN is high. If clock signal CLK is used to gate pulldown N3 (i.e., if clock divider 622 is omitted), the amount of time that the pulldown path through resistor R1 is pulling down on internal node AA is reduced (e.g., by half, if clock signal CLK has a 50 percent duty cycle).

In the pictured embodiment, clock signal CLK is provided to clock divider 622. Clock divider 622 further reduces the amount of time in which pulldown N3 is turned on. For example, if clock signal CLK has a 50 percent duty cycle and clock divider 622 is a divide-by-64 divider, pulldown N3 is turned on only 1/128th of the time that enable signal EN is active.

In one embodiment, the ramp up circuit forms a portion of a PLD, and clock divider 622 is a programmable clock divider controlled by one or more programmable memory cells of the PLD.

Figure 7:
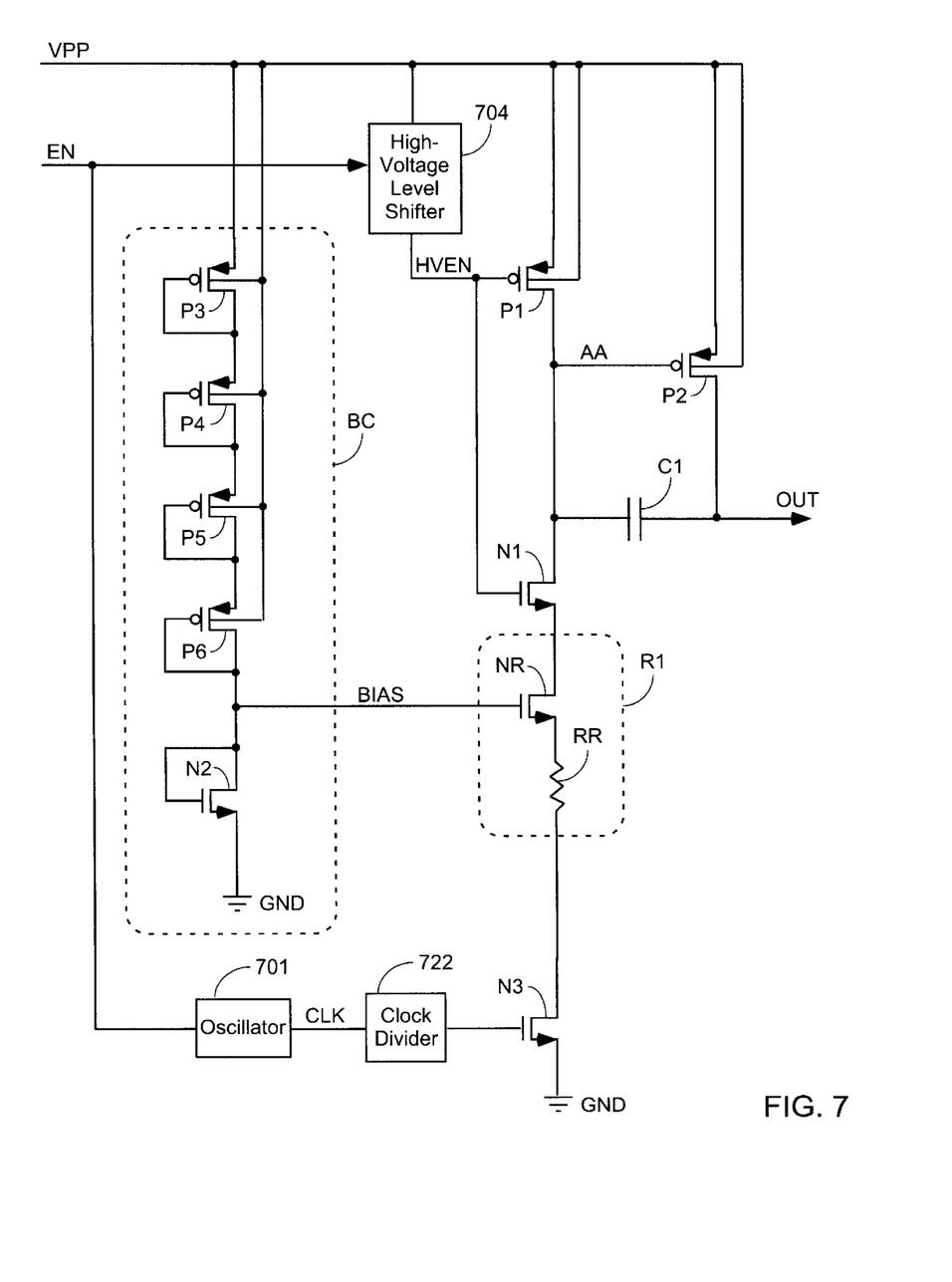
FIG. 7 shows a fourth self-regulating ramp up circuit according to an embodiment of the invention.

FIG. 7 shows a fourth self-regulating ramp up circuit according to the invention that combines many of the features previously shown in the other embodiments. The ramp up circuit of FIG. 7 is implemented in an IC fabricated using a CMOS process. Pullups and pulldowns are implemented with P-channel transistors and N-channel transistors, respectively, as in the embodiment of FIG. 5. Well known oscillators, clock dividers, and level shifters can be used with the circuit of FIG. 7.

Table 1 shows device sizes for one embodiment. Gate lengths are longer than standard gate lengths because these gates are coupled to high power level VPP, which in one embodiment is about 15 volts, rather than to a standard operating voltage such as 1.8 volts. An exception is pulldown N3, which is gated by a signal at the standard operating voltage. Gate sizes are in microns.

TABLE 1

| Device | Width | Length | Device Type |
|--------|-------|--------|-------------|
| P1 | 20 | 1.9 | P-channel Transistor |
| P2 | 20 | 1.9 | P-channel Transistor |
| P3 | 5 | 2 | P-channel Transistor |
| P4 | 5 | 2 | P-channel Transistor |
| P5 | 5 | 2 | P-channel Transistor |
| P6 | 5 | 2 | P-channel Transistor |
| N1 | 10 | 1.2 | N-channel Transistor |
| N2 | 18 | 2 | N-channel Transistor |
| N3 | 10 | 0.22 | N-channel Transistor |
| NR | 2 | 10 | N-channel Transistor |
| RR | 0.5 | 1845 | Polysilicon Line; Resistance = 1.5 megaOhms |
| C1 | 46 | 20 | Diffusion and Polysilicon; Capacitance = 2.7 picoFarads |

Note the length of the polysilicon line used to implement resistive element RR in the embodiment of FIG. 7 (see Table 1). The polysilicon line is 1845 microns long, which consumes a significant amount of silicon area. However, when pulldown N3 is omitted, as shown in the embodiment of FIG. 5, a polysilicon line 3444 microns long is needed to achieve a similar output waveform. However, a lower resistance value on resistive element RR can be used to achieve the same output waveform if other resistances on the pulldown path (e.g., those of pulldowns NR and/or N3) are increased using the methods described above or by applying well-known methods for adjusting the resistance of a circuit path.

Those having skill in the relevant arts of the invention will now perceive various modifications and additions that can be made as a result of the disclosure herein. For example, the above text describes the circuits and methods of the invention in the context of ICs such as programmable logic devices (PLDs). However, the circuits of the invention can also be implemented in other electronic systems, for example, in printed circuit boards including discrete devices.

Further, resistors, capacitors, pullups, pulldowns, transistors, P-channel transistors, N-channel transistors, level shifters, biasing circuits, oscillators, clock dividers, and other components other than those described herein can be used to implement the invention. Active-high signals can be replaced with active-low signals by making straightforward alterations to the circuitry, such as are well known in the art of circuit design. Moreover, some components are shown directly connected to one another while others are shown connected via intermediate components. In each instance, the method of interconnection establishes some desired electrical communication between two or more circuit nodes. Such communication may often be accomplished using a number of circuit configurations, as will be understood by those of skill in the art. Accordingly, all such modifications and additions are deemed to be within the scope of the invention, which is to be limited only by the appended claims and their equivalents.

What is claimed is:

1. A self-regulating ramp up circuit, comprising:
   an enable input terminal;
   a power high terminal;
   a ground terminal;
   a ramp up output terminal;
   an internal node;
   a resistor;
   a level shifter having an input terminal coupled to the enable input terminal, an output terminal, and a power terminal coupled to the power high terminal;
   a first pullup coupled between the power high terminal and the internal node, the first pullup having a gate terminal coupled to the output terminal of the level shifter;
   a second pullup coupled between the power high terminal and the ramp up output terminal, the second pullup having a gate terminal coupled to the internal node;
   a capacitor coupled between the internal node and the ramp up output terminal; and
   a first pulldown having a gate terminal coupled to the output terminal of the level shifter,
   wherein the first pull down and the resistor are coupled in series between the internal node and the ground terminal, and
   wherein the resistor comprises a resistance element and a second pulldown coupled in series, the second pulldown having a gate terminal coupled to receive a biasing signal.

2. The self-regulating ramp up circuit of claim 1, wherein the first pulldown is coupled between the internal node and the resistor, and the resistor is coupled between first pulldown and the ground terminal.

3. The self-regulating ramp up circuit of claim 1, wherein the ramp up circuit forms a portion of a programmable logic device, and the capacitor has a programmable capacitance value.

4. The self-regulating ramp up circuit of claim 1, wherein the ramp up circuit forms a apportion of a programmable logic device, and the resistor has a programmable resistance value.

5. A programmable logic device (PLD), comprising:
   an enable input terminal;
   a power high terminal;
   a ground terminal;
   a ramp up output terminal;
   an internal node;
   a resistor;
   a level shifter having an input terminal coupled to the enable input terminal, an output terminal, and a power terminal coupled to the power high terminal;
   a first pullup coupled between the power high terminal and the internal node, the first pullup having a gate terminal coupled to the output terminal of the level shifter;
   a second pullup coupled between the power high terminal and the ramp up output terminal, the second pullup having a gate terminal coupled to the internal node;
   a programmable capacitor coupled between the internal node and the ramp up output terminal, the programmable capacitor having a programmed capacitance value based on configuration data for the PLD; and
   a first pulldown having a gate terminal coupled to the output terminal of the level shifter,
   wherein the first pulldown and the resistor are coupled in series between the internal node and the ground terminal, and wherein the resistor comprises a resistance element and a second pulldown coupled in series, the second pulldown having a gate terminal coupled to receive a biasing signal.

6. The self-regulating ramp up circuit of claim 1, wherein:

the ramp up circuit forms a portion of a programmable logic device;

the ramp up circuit further comprises a programmable biasing circuit; and the gate terminal of the second pulldown is coupled to the programmable biasing circuit.

7. The self-regulating ramp up circuit of claim 1, wherein:

the ramp up circuit further comprises a biasing circuit having an output terminal coupled to the gate terminal of the second pulldown; and the biasing circuit comprises one or more additional pullups coupled in series between the power high terminal and the gate terminal of the second pulldown and further comprises one or more additional pulldowns coupled between the gate terminal of the second pulldown and the ground terminal.

8. The self-regulating ramp up circuit of claim 1, wherein:

the first and second pullups comprise P-channel transistors having substrate terminals coupled to the power high terminal; and the first pulldown comprises an N-channel transistor.

9. A self-regulating ramp up circuit, comprising:

an enable input terminal;

a power high terminal;

a ground terminal;

a ramp up output terminal;

an internal node;

a resistor;

a level shifter having an input terminal coupled to the enable in out terminal an output terminal, and a power terminal coupled to the power high terminal;

a first pullup coupled between the power high terminal and the internal node, the first pullup having a gate terminal coupled to the output terminal of the level shifter;

a second pullup coupled between the power high terminal and the ramp up output terminal, the second pullup having a gate terminal coupled to the internal node;

a capacitor coupled between the internal node and the ramp up output terminal;

a first pulldown having a gate terminal coupled to the output terminal of the level shifter, wherein the first pulldown and the resistor are coupled in series between the internal node and the around terminal;

an oscillator having an input terminal coupled to the enable input terminal and an output terminal; and a second pulldown coupled in series with the first pulldown and the resistor between the internal node and the ground terminal, the second pulldown having a gate terminal coupled to the output terminal of the oscillator.

10. The self-regulating ramp up circuit of claim 9, further comprising a clock divider coupled between the oscillator and the gate terminal of the second pulldown.

11. A self-regulating ramp up circuit, comprising:

an enable input terminal providing a low voltage enable signal operating at a first voltage level;

a power high terminal supplying a second voltage level higher than the first voltage level;

a ground terminal;

a ramp up output terminal;

an internal node;

a level-shifting circuit coupled to receive the low voltage enable signal and to provide from the low voltage enable signal a high voltage enable signal operating at the second voltage level;

an inverter coupled between the power high terminal and the ground terminal, the inverter having an input terminal coupled to receive the high voltage enable signal and an output terminal, the inverter comprising a resistor in a pulldown path;

a first pullup coupled between the power high terminal and the ramp up output terminal, the first pullup having a gate terminal coupled to the output terminal of the inverter; and a capacitor coupled between the output terminal of the inverter and the ramp up output terminal, wherein the resistor comprises a resistance element and a second pulldown coupled in series, the second pulldown having a gate terminal coupled to receive a biasing signal.

12. The self-regulating ramp up circuit of claim 11, wherein the inverter comprises:

a second pullup coupled between the power high terminal and the output terminal of the inverter and having a gate terminal coupled to the receive the high voltage enable signal; and a first pulldown coupled between the output terminal of the inverter and the resistor and having a gate terminal coupled to the receive the high voltage enable signal, wherein the resistor is coupled between the first pulldown and the ground terminal.

13. The self-regulating ramp up circuit of claim 11, wherein the ramp up circuit forms a portion of a programmable logic device, and the capacitor has a programmable capacitance value.

14. The self-regulating ramp up circuit of claim 11, wherein the ramp up circuit forms a portion of a programmable logic device, and the resistor has a programmable resistance value.

15. The self-regulating ramp up circuit of claim 11, wherein:

the ramp up circuit forms a portion of a programmable logic device;

the ramp up circuit further comprises a programmable biasing circuit; and the gate terminal of the second pulldown is coupled to the programmable biasing circuit.

16. The self-regulating ramp up circuit of claim 11, wherein:

the ramp up circuit further comprises a biasing circuit having an output terminal coupled to the gate terminal of the second pulldown; and the biasing circuit comprises one or more additional pullups coupled in series between the power high terminal and the gate terminal of the second pulldown and further comprises one or more additional pulldowns coupled between the gate terminal of the second pulldown and the ground terminal.

17. The self-regulating ramp up circuit of claim 11, wherein:
the first pullup comprises a P-channel transistor having a substrate terminal coupled to the power high terminal.

18. A self-regulating ramp up circuit, comprising:
an enable input terminal providing a low voltage enable signal operating at a first voltage level;
a power high terminal supplying a second voltage level higher than the first voltage level;
a ground terminal;
a rams up output terminal;
an internal node;
a level-shifting circuit coupled to receive the low voltage enable signal and to provide from the low voltage enable signal a high voltage enable signal operating at the second voltage level;
an inverter coupled between the power high terminal and the ground terminal the inverter having an input terminal coupled to receive the high voltage enable signal and an output terminal, the inverter comprising a resistor in a pulldown path;
a first pullup coupled between the power high terminal and the ramp up output terminal, the first pullup having a gate terminal coupled to the output terminal of the inverter; and
a capacitor coupled between the output terminal of the inverter and the ramp up output terminal,
wherein the inverter further comprises a pulldown on the pulldown path, the ramp up circuit further comprising:
an oscillator coupled to receive the low voltage enable signal and to provide a clock signal to a gate terminal of the pulldown.

19. The self-regulating ramp up circuit of claim 18, further comprising a clock divider coupled between the oscillator and the gate terminal of the pulldown.

20. A programmable logic device (PLD), comprising:
an enable input terminal;
a power high terminal;
a ground terminal;
a ramp up output terminal;
an internal node;
a programmable resistor having a programmed resistance value based on configuration data for the PLD;
a level shifter having an input terminal coupled to the enable input terminal, an output terminal, and a power terminal coupled to the power high terminal;
a first pullup coupled between the power high terminal and the internal node, the first pullup having a gate terminal coupled to the output terminal of the level shifter;
a second pullup coupled between the power high terminal and the ramp up output terminal, the second pullup having a gate terminal coupled to the internal node;
a capacitor coupled between the internal node and the ramp up output terminal; and
a first pulldown having a gate terminal coupled to the output terminal of the level shifter,
wherein the first pulldown and the programmable resistor are coupled in series between the internal node and the ground terminal, and
wherein the resistor comprises a resistance element and a second pulldown coupled in series, the second pulldown having a gate terminal coupled to receive a biasing signal.

21. The self-regulating ramp up circuit of claim 20, wherein the capacitor is a programmable capacitor having a programmed capacitance value based on configuration data for the PLD.

* * * * *